US005528456A

United States Patent [19]
Takahashi

[11] Patent Number: 5,528,456
[45] Date of Patent: Jun. 18, 1996

[54] PACKAGE WITH IMPROVED HEAT TRANSFER STRUCTURE FOR SEMICONDUCTOR DEVICE

[75] Inventor: Nobuaki Takahashi, Tokyo, Japan

[73] Assignee: NEC Corporation, Tokyo, Japan

[21] Appl. No.: 341,933

[22] Filed: Nov. 15, 1994

[30] Foreign Application Priority Data

Nov. 15, 1993 [JP] Japan .................................. 5-306999

[51] Int. Cl.$^6$ ...................................................... H05K 7/20
[52] U.S. Cl. .......................... 361/704; 165/80.2; 165/185; 174/16.3; 257/713; 361/715
[58] Field of Search .................................. 165/80.2, 185; 174/16.3; 257/706–707, 712–713, 722; 361/704–710, 714–719, 722

[56] References Cited

U.S. PATENT DOCUMENTS

| | | |
|---|---|---|
| 2,920,245 | 1/1960 | Anderson et al. ...................... 165/80.2 |
| 3,694,699 | 9/1972 | Snyder et al. ........................... 361/704 |
| 4,270,604 | 6/1981 | Nakamura ............................... 361/704 |
| 4,763,225 | 8/1988 | Frenkel et al. ........................... 361/709 |
| 4,926,935 | 5/1990 | Haushalter ............................... 165/80.2 |
| 5,268,813 | 12/1993 | Chapman ................................ 361/704 |

FOREIGN PATENT DOCUMENTS 1432819  10/1988  U.S.S.R. ................................ 361/704

Primary Examiner—Gregory D. Thompson
Attorney, Agent, or Firm—Young & Thompson

[57] ABSTRACT

The invention provides a package with an improved semiconductor device heat transfer structure including a semiconductor integrated circuit chip mounted on a substrate, a package for receiving the semiconductor integrated circuit chips mounted on the substrate, a radiator being attached to the package for radiation of a heat to an exterior and for sealing the package and a foil which made of a heat conductive material has corrugations having top portions in contact with the chip and bottom portions in contact with the radiator for transferring the heat from the semiconductor integrated circuit chip to the radiator.

23 Claims, 9 Drawing Sheets

PACKAGE WITH IMPROVED HEAT TRANSFER STRUCTURE FOR SEMICONDUCTOR DEVICE

BACKGROUND OF THE INVENTION

1. Field of the Invention

This invention relates to a package for a semiconductor device, and more particularly to a heat transfer structure in the package for the semiconductor device.

2. Description of the Related Art

Semiconductor integrated circuit chips are required to have a high integration level so as to improve their performance. Further, multi-chip packaging technologies are utilized to permit semiconductor integrated circuit chips to have a high density in order to shorten a length of an interconnection between the semiconductor integrated circuit chips. Thus, a package, particularly a multi-chip module, includes a plurality of semiconductor integrated circuit chips. In accordance with the above requirement, the package of the semiconductor integrated circuit chips has a disadvantage in a heat accumulation in the package. The accumulation of the heat in the package makes for poor performances and reliability of the integrated circuits. Particularly, as high speed performance and a high integration of the semiconductor integrated circuit, chips are required, the above problem in the heat generation is more serious. Whether the high integrated circuit chips are able to exhibit excellent performances such as a high speed performance and to have a high reliability depends upon the heat transferring structure. It is, thus, very important for the high density packaging technology how to remove the heat generated by the semiconductor integrated circuit chips to the exterior of the package.

FIG. 1 is a cross sectional view showing the prior art. In the prior art, a plurality of semiconductor integrated circuit chips 21 are placed on a mounting substrate 23 through bumps 22 by use of a flip chip bonding method and the like to be placed in a package 24. The mounting substrate 23 is electrically connected to leads 25 provided to the package 24 through metal wires 26. A cap 27 is attached to a surface of each of the semiconductor integrated chips 21 to seal the package 24. A heat sink is provided on the cap 27.

According to the prior art, the heat generated from the semiconductor integrated circuit chips 21 can be removed through the cap 27 and the heat sink 28 to the exterior of the package 24.

The prior art is, however, engaged with a disadvantage as follows. A face of each of the semiconductor integrated circuit chips 21 is in contact with one surface of the cap 27 whose opposite surface is in contact with the heat sink 28. The semiconductor integrated circuit chips 21, the cap 27 and the heat sink 28 have different coefficients of thermal expansion respectively, for which reason a stress occurs between those, thereby resulting in an appearance of a disconnection between the semiconductor integrated circuit chips 21 and the mounting substrate 23, and also in an appearance of a crack in the semiconductor integrated circuit chips 21.

To settle the above issues, another heat transfer structure is disclosed in the Japanese laid open patent application No. 63-287038. FIG. 2 is a cross sectional view showing this other prior art.

In this other prior art, a plurality of semiconductor integrated circuit chips 31 are placed on a mounting substrate 33 through solder 32 to be sealed by a cap 37 made of a material having a high thermal conductivity, such as copper and the like. A high thermal conductive plate 34 is attached to a face of the semiconductor integrated circuit chip 31. The semiconductor integrated circuit chip 31 and the cap 37 are connected through a heat conductor 35 which comprises flexible metal fibers. The cap 37 is attached to the mounting substrate 33 by metal bellows 36.

In such structure, the semiconductor integrated circuit chip 31 and the cap 37 are connected through the high thermal conductive plate 34 and the heat conductors 35 so that the heat generated from the semiconductor integrated circuit chip 31 can easily be transferred to the cap 37 to radiate it to the exterior. In addition, the heat conductor 35 comprising the flexible metal fibers. Thus, a thermal stress occurring between the semiconductor integrated circuit chip 31 and the cap 37 due to their different coefficient of thermal expansion can be absorbed and mitigated in the heat conductors 35. Namely, the heat conductors 35 can prevent the semiconductor integrated circuit chip 31 from cracking and also prevent the connection the semiconductor integrated circuit chip 31 with the mounting substrate 33 from breaking.

Further, the metal bellows 36 comprises metal thin plates. The metal thin plates are attached to each other for formation of the metal bellows 36. Therefore, the metal bellows 36 is able to absorb or mitigate a stress occurring between the cap 37 and the mounting substrate 33 corresponding to a relative displacement between them.

This other prior art is, however, engaged with a disadvantage in the following. The heat conductor 35 is required to comprise thin metal fibers spaced from each other and to leave a space for high flexibility. An effective area of the heat conductors 35 is small, thereby a thermal resistance of the heat conductors 35 is high to result in a low heat radiation efficiency.

If thick metal fibers are provided as the heat conductor 35 at a narrow space for obtaining a high heat radiation, a rigidity of the heat conductors 35 becomes high. This makes it difficult to obtain a high flexibility. It is, therefore, difficult to absorb or mitigate a thermal stress occurring in the semiconductor integrated circuit chips 31. Further, a fabricating process of the heat conductor 35 becomes complicated and its cost rises since it is required to have a predetermined space between the metal fibers and to have a predetermined length in the metal fibers.

SUMMARY OF THE INVENTION

Accordingly, it is an object of the invention to provide a novel package with improved heat transfer structure for a semiconductor device.

It is a further object of the invention to provide a novel package which has an improved heat transfer structure for a semiconductor device.

It is a still further object of the invention to provide a novel package which can absorb or mitigate a thermal stress against a semiconductor device.

The above and other objects, features and advantages of the present invention will be apparent from the following descriptions.

In accordance with the invention, there is provided a high heat transfer structure for a semiconductor device comprising a semiconductor integrated circuit chip mounted on a substrate, a radiator of a heat to an exterior and a foil which made of a heat conductive material has corrugations having top portions in contact with the chip and bottom portions in contact with the radiator for transferring the heat from the semiconductor integrated circuit chip to the radiator.

In the high heat transfer structure for a semiconductor device, the foil includes grooves extending at the top portions, the bottom portions or both of the top and bottom portions in a crosswise direction of the corrugation. Further, a resin having a high thermal conductivity and a flexibility is provided on at least one surface of the foil.

There is also provided a package with an improved heat transfer structure for a semiconductor device comprising a semiconductor integrated circuit chip mounted on a substrate, a package for receiving the semiconductor integrated circuit chips mounted on the substrate, a radiator attached to the package for radiation of a heat to an exterior and for sealing the package and a foil made of a heat conductive material has corrugations having top portions in contact with the chip and bottom portions in contact with the radiator for transferring the heat from the semiconductor integrated circuit chip to the radiator.

In a package with an improved heat transfer structure for a semiconductor device, the foil includes grooves extending at the top portions, the bottom portions or both of the top and bottom portions in a crosswise direction of the corrugation. Further, a resin having a high thermal conductivity and a flexibility is provided on at least one surface of the foil.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 3:
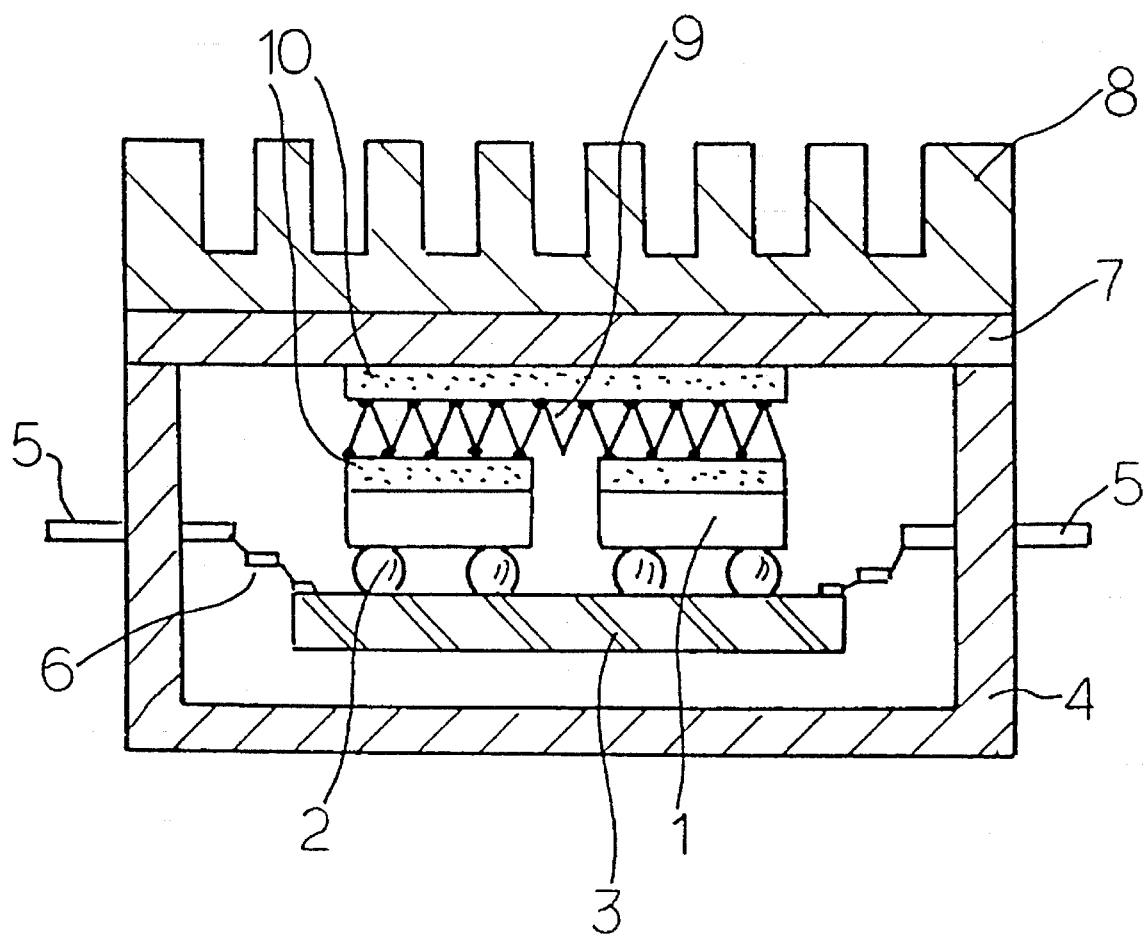
FIG. 3 is a cross sectional view showing the structure of a package with an improved transfer structure for semiconductor device of a first embodiment according to the invention.

A first embodiment according the invention will be described with reference to the drawings. FIG. 3 shows a package with an improved heat transfer device for semiconductor device.

A semiconductor integrated circuit chips 1 made of silicon and the like comprises active elements such as a transistor and passive elements such as a resistor. The semiconductor integrated circuit chips 1 are mounted on a mounting substrate 3 respectively through bumps 2 which are formed on electrode pads of the semiconductor integrated circuit chips 1 by use of a flip tip bonding method. The bumps 2 are made of a solder which comprises, for example, lead (Pb) (95% by weight) and tin (Sn) (5% by weight). The mounting substrate 3 is made of a material having a predetermined coefficient of thermal expansion similar to that of the semiconductor integrated circuit chips 1.

The mounting substrate 3 mounting the semiconductor integrated circuit chips 1 is placed in a package 4 and then the semiconductor integrated circuit chips 1 are electrically connected to leads 5 provided to the package 4. In the connection the semiconductor integrated circuit chips 1 with the leads 5, a tape automated bonding (TAB) 6 is used to support the mounting substrate 3 in the package 4, wherein the mounting substrate 3 is suspended from the leads 5 for support. A cap 7 made of Kovar and the like is attached to an opening of the top of the package 4 by the solder made of, for example, Pb (37% by weight) and Sn (63% by weight) for seal thereof. Subsequently, a heat sink 8 made of aluminum (Al) and the like is attached on the cap 7.

Figure 4:
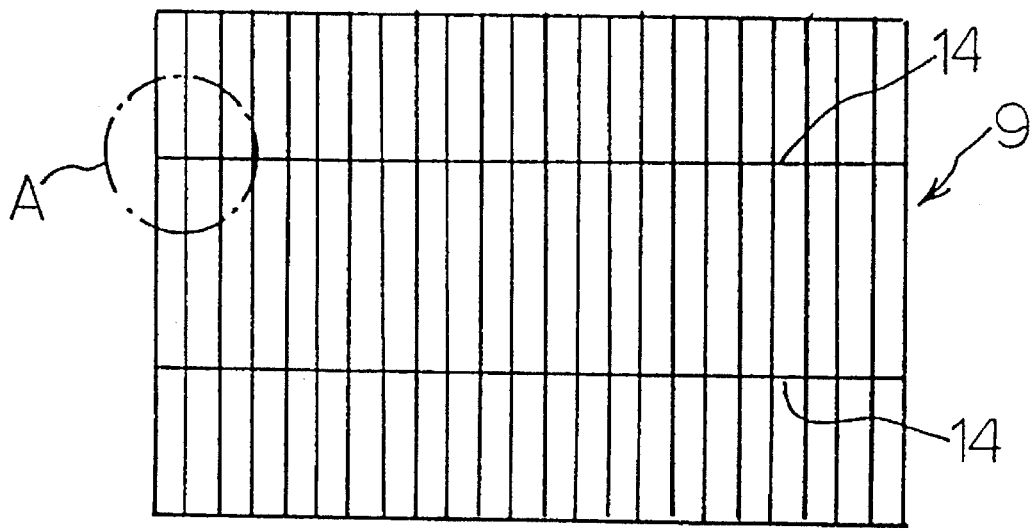
FIG. 4A is a plan view showing the structure of a heat transfer foil of a first embodiment according to the invention.
FIG. 4B is a perspective view showing the structure of a heat transfer foil of a first embodiment according to the invention.
Figure 4:
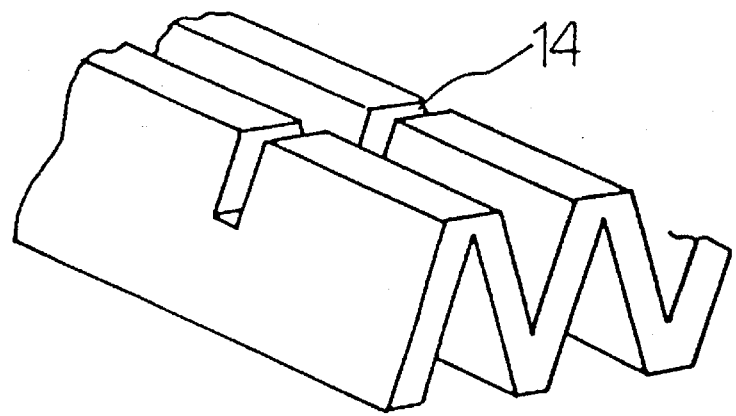

A heat transfer foil is provided between the semiconductor integrated circuit chips 1 and the cap 7. The heat transfer foil is made of aluminum, aluminum alloy, copper or copper alloy and have a corrugated structure having top portions and bottom portions. FIG. 4A shows a plan view of the heat transfer foil 9 and FIG. 4B shows a perspective view, which is taken on circle A of FIG. 4A, of the heat transfer foil 9. As shown in FIGS. 4A and 4B, a thin metal plate is pressed to have the corrugated structure, in which corrugations continue in a crosswise direction of the thin metal plate. A plurality of grooves 14 are formed in the top portion of the heat transfer foil 9 to separate partially the corrugations in a lengthwise direction and also extends in a crosswise direction of the heat transfer foil 9. In the first embodiment, there are provided two grooves 14 on the top portions of the heat transfer foil 9. The grooves 14 may be provided to the bottom of the heat transfer foil 9 or both the top and bottom portions. In the first embodiment, for instance, the heat transfer foil 9 has the thickness of approximately 20 to 100 micrometers, the pitch between the top portions or the bottom portions is approximately 0.5 to 2 millimeters and the height of the corrugation is approximately 0.5 to 2 millimeters.

The bottom portions of the heat transfer foil 9 are attached to a back surface of the semiconductor integrated circuit chips 1 which is opposite to the surface attached to the mounting substrate 3 through bumps 2. The top portions of the heat transfer foil 9 are also attached to a surface of the cap 7 which is opposite to the surface attached to the heat sink 8. In this case, although it is difficult to attach the heat transfer foil 9 to the semiconductor integrated circuit chips 1 and the cap 7 through solder 10 made of Sb and Pb when Al and the like are used as a material of the heat transfer foil 9, Cu and the like which can directly be attached to the solder made of Sb and Pb may be applied to the surface of the top and/or bottom of the heat transfer foil 9 to be attached, or be applied to all surface of the heat transfer foil 9 to completely attach them.

In operation, when heat is generated by the plurality of semiconductor integrated circuit chips 1, the heat transfer foil 9 is heated. Since the heat transfer foil 9 has a high heat conductivity, the heat is transmitted through the heat transfer foil 9 to the cap 7. The heat is then transferred to the heat sink 8 from the cap 7, after which the heat is radiated from the heat sink 8 to the exterior of the package of the semiconductor device.

In more detail, the heat transfer foil 9 is made of a material having a high thermal conductivity such as Al, Cu and the like and has a corrugated structure having the top and bottom portions for increasing its effective area in order to be attached to both of the semiconductor integrated circuit chips 1 and the cap 7 by utilizing the wide area of the heat transfer foil 9. Therefore, a thermal resistance of all the heat transfer foil 9 can be reduced. Thus, the heat generated from the semiconductor integrated circuit chips 1 is effectively transferred to the cap 1 through the heat transfer foil 9, radiating the heat to the exterior of the package 24 from the heat sink 8. Consequently, the heat radiation of the package can be improved.

Figure 11:
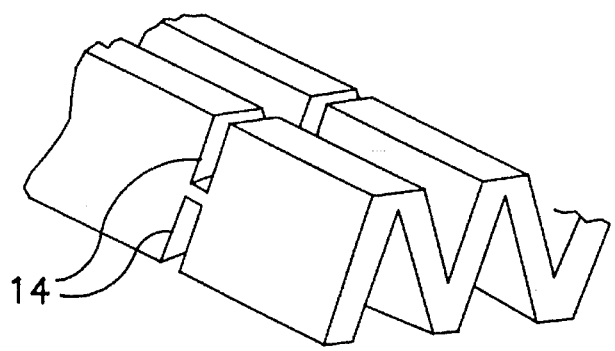
FIG. 11 is a perspective view showing a second alternate structure of a heat transfer foil according to the invention.

A coefficient of thermal expansion of the semiconductor integrated circuit chips 1 is different from that of the cap 7. Thus, a thermal stress on account of the above difference appeases between the semiconductor integrated circuit chips 1 and the cap 7 by a heat history. The heat transfer foil 9 is, however, excellent in its flexibility of a lengthwise and a crosswise direction since it has the corrugated structure and is provided with the grooves 14 in the top or top and bottom portions, as in FIG. 11. Therefore, the heat transfer foil 9 can absorb and mitigate the thermal stress. As a result, no influence of difference in the thermal expansion appears between the semiconductor integrated circuit chips 1 and the cap 7.

Figure 1:
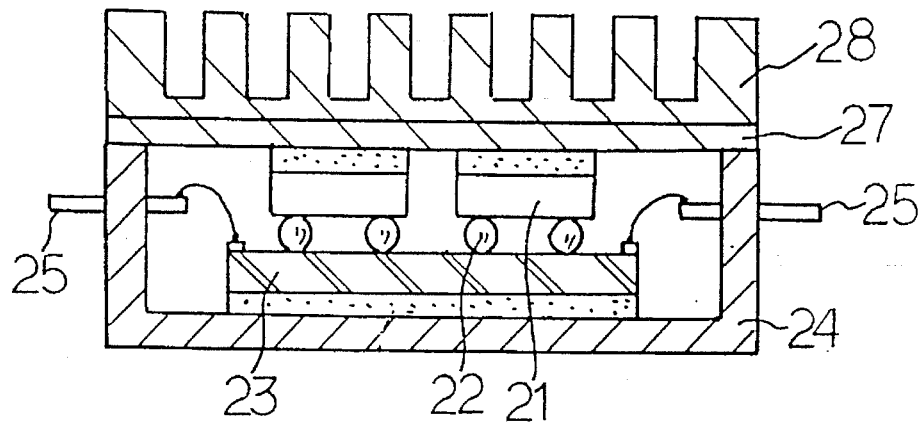
FIG. 1 is a cross sectional view showing the structure of the conventional package for the semiconductor device.
Figure 2:
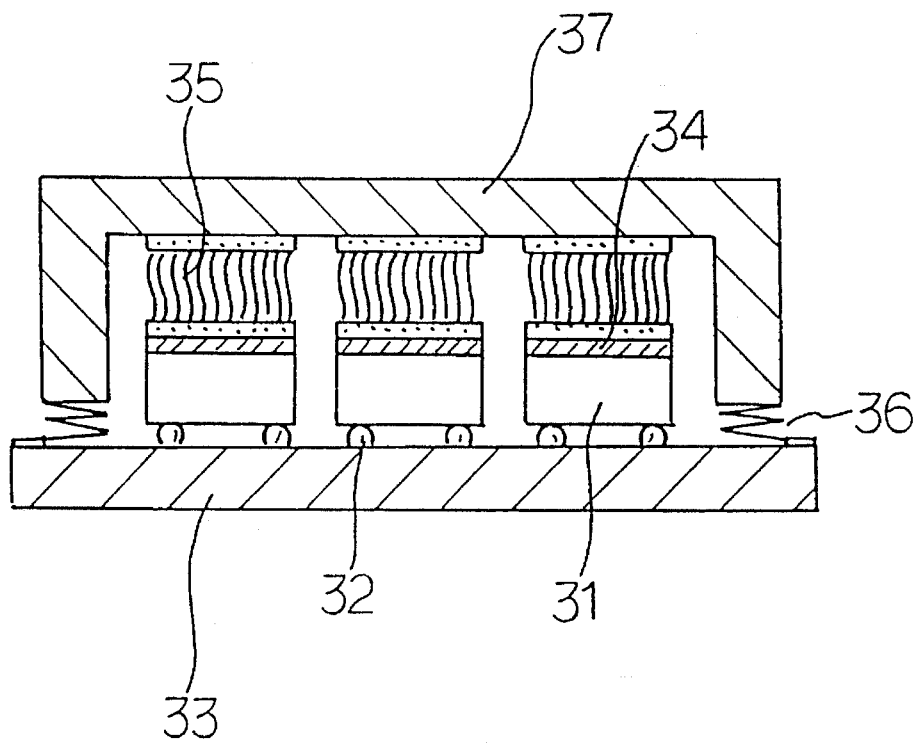
FIG. 2 is a cross sectional view showing the structure of the conventional package for the semiconductor device.
Figure 5A:
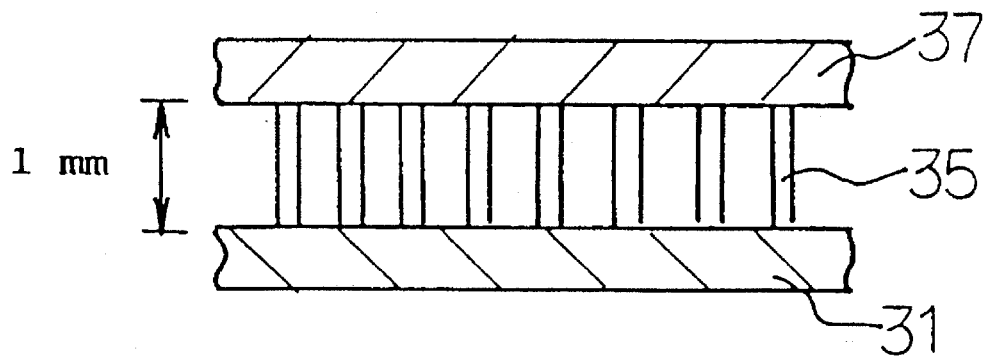
FIG. 5A is a cross sectional view showing the heat transfer structure of the conventional package for comparison with that of a first embodiment according to the invention.
Figure 5B:
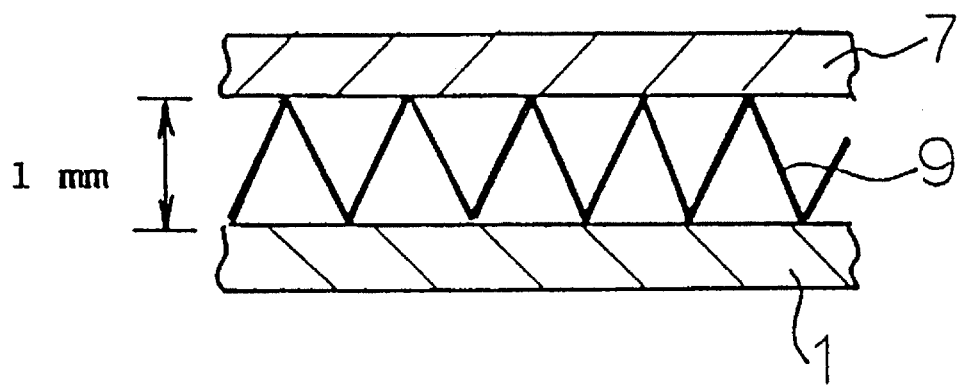
FIG. 5B is a cross sectional view showing the heat transfer structure of a first embodiment of the invention for comparison with that of the conventional package shown in FIG. 5A.

The thermal resistance will be explained by use of, for instance, a semiconductor integrated circuit chip having an area of 10 mm$^2$. FIGS. 5A and 5B are models for calculating thermal resistance. FIG. 5A shows a high heat transfer structure shown in FIG. 2 and FIG. 5B shows a high heat transfer structure shown in FIG. 3.

In the structure of the first embodiment as shown in FIG. 5B, a material of the heat transfer foil 9 is Cu having a thermal conductivity of 395 w/m.k, the thickness of the heat transfer foil 9 is 50 micrometers, the pitch between the corrugations is 1 millimeter and the height of the corrugation is 1 millimeter. As a result of the calculation, it is obtained the thermal resistance of 0.28 k/w from the above structure of the first embodiment.

On the other hand, for obtaining the same amount of the thermal resistance as the first embodiment in the conventional structure as shown in FIG. 5A, its structure is the following. In FIG. 5A, when the material of the metal fiber of the heat conductor 35 is Cu and its thickness is 50 micrometers, 4,600 of the metal fibers must be provided in an area of 10 mm$^2$ with a pitch of approximately 150 micrometers. In addition, the flexibility of the heat conductor 35 is reduced. This makes it difficult to mitigate the thermal stress in the above structure. It is also difficult to fabricate the above structure, thus increasing the cost of fabricating the products.

Figure 12:
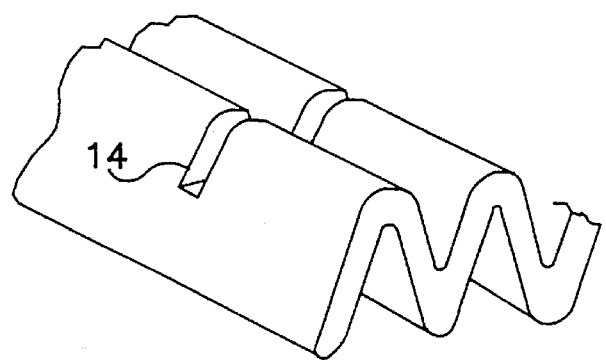
FIG. 12 is a perspective view showing a third alternate structure of a heat transfer foil according to the invention.

In the first embodiment, the structure of the heat transfer foil 9 may be selected from a V-shaped corrugated structure and a curved corrugated structure, as in FIG. 12. Further, even if the heat transfer foil is provided to extend on the plurality of the semiconductor integrated circuit chips 1 mounted on the mounting substrate 3, a plurality of the heat transfer foil 9 is prepared and may be provided for each semiconductor integrated circuit chips 1 respectively. The fabrication of the heat transfer foil 9 is easy and it is easily, therefore, assembled to the package. Then, the cost of fabricating the package can be reduced.

Figure 6:
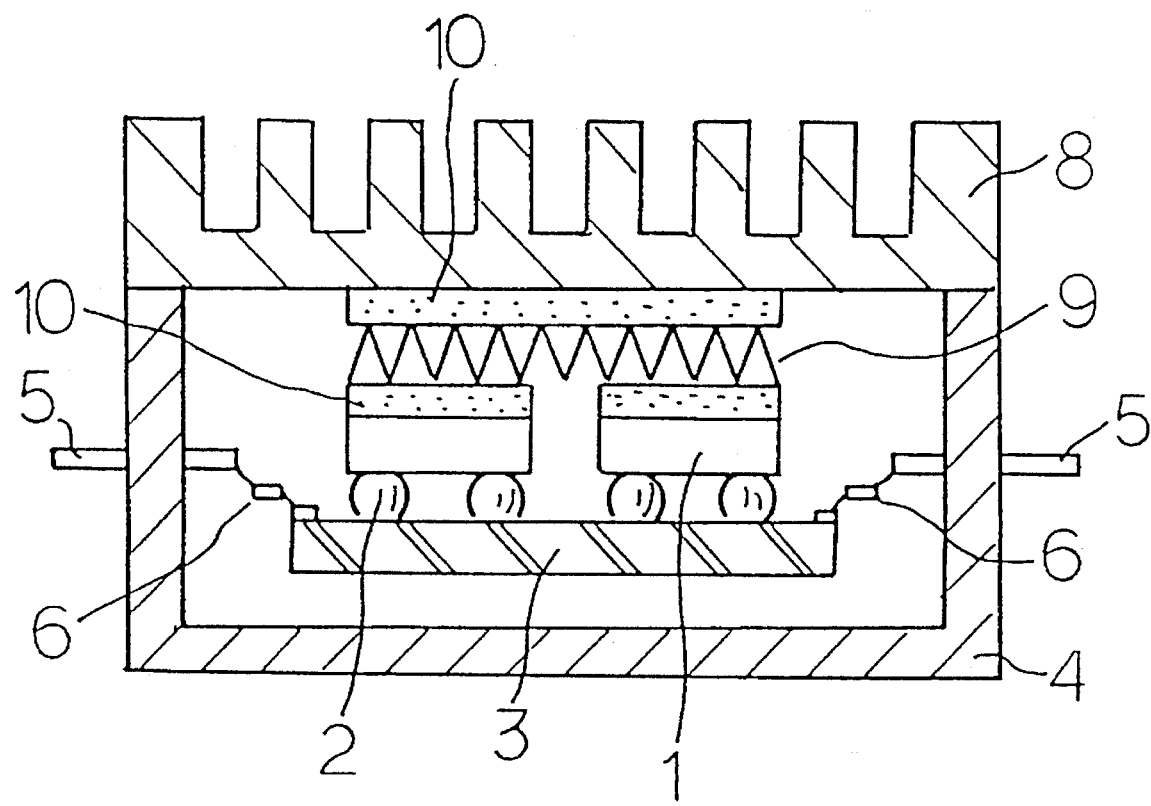
FIG. 6 is a cross sectional view showing the structure of a package with an improved heat transfer device for a semiconductor device of a second embodiment according to the invention.

A second embodiment according the invention will be described with reference to the drawings. FIG. 6 shows a package with an improved heat transfer device for a semiconductor device.

A semiconductor integrated circuit chips 1 made of silicon and the like comprises active elements such as a transistor and passive elements such as a resistor. The semiconductor integrated circuit chips 1 are mounted on a mounting substrate 3 respectively through bumps 2 which are formed on electrode pads of the semiconductor integrated circuit chips 1 by use of a flip tip bonding method. The bumps 2 are made or a solder which comprises, for example, lead (Pb) (95% by weight) and tin (So) (5% by weight). The mounting substrate 3 is made of a material having a predetermined coefficient of thermal expansion similar to that of the semiconductor integrated circuit chips 1.

The mounting substrate 3 mounting the semiconductor integrated circuit chips 1 is placed in a package 4 and then the semiconductor integrated circuit chips 1 are electrically connected to leads 5 provided to the package 4. In the connection the semiconductor integrated circuit chips 1 with the leads 5, a tape automated bonding (TAB) 6 is used to support the mounting substrate 3 in the package 40 wherein the mounting substrate 3 is suspended from the leads 5 for support. A heat sing 8 made of aluminum and the like is attached to an opening of the top of the package 4 for seal thereof.

Figure 7A:
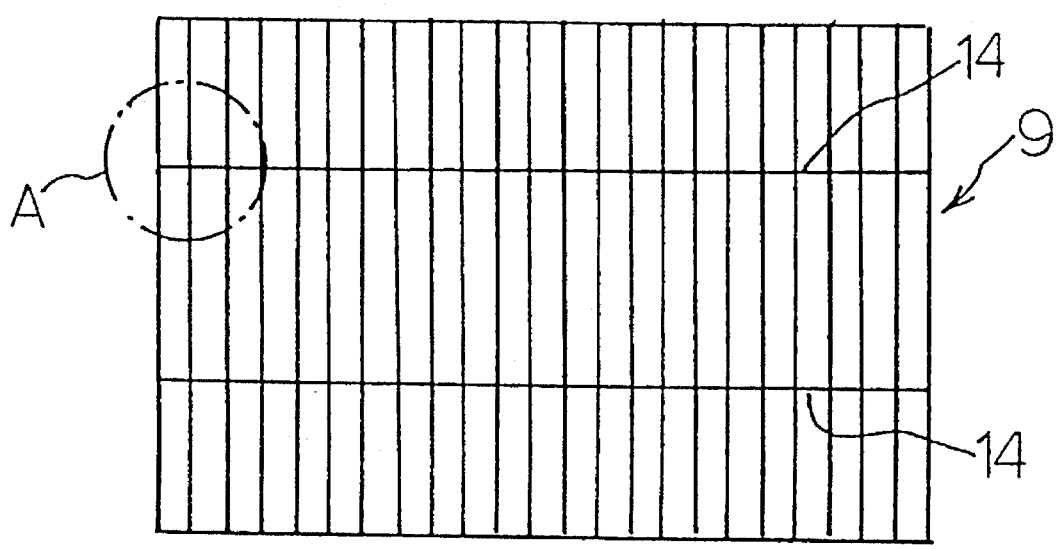
FIG. 7A is a plan view showing the structure of a heat transfer foil of a second embodiment according to the invention.
Figure 7B:
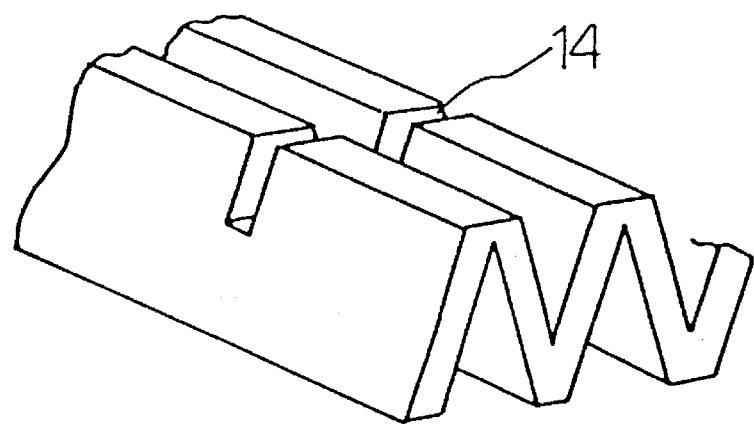
FIG. 7B is a perspective view showing the structure of a heat transfer foil of a second embodiment according to the invention.
Figure 10:
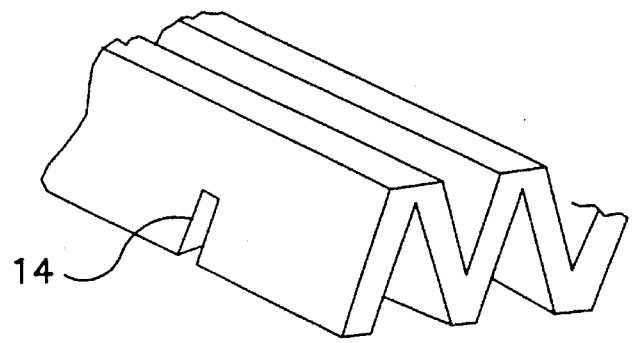
FIG. 10 is a perspective view showing an alternate structure of a heat transfer foil according to the invention.

A heat transfer foil 9 is provided between the semiconductor integrated circuit chips 1 and the heat sink 8. The heat transfer foil 9 is made of aluminum, aluminum alloy, copper or copper alloy and has a corrugated structure having top portions and bottom portions. FIG. 7A shows a plan view of the heat transfer foil 9 and FIG. 7B shows a perspective view, which is taken on circle A of FIG. 7A, of the heat transfer foil 9. As shown in FIGS. 7A and 7B, a thin metal plate is pressed to have the corrugated structure, in which corrugations continue in a crosswise direction of the thin metal plate. A plurality of grooves 14 are formed in the top portion of the heat transfer foil 9 to separate partially the corrugations in a lengthwise direction and also extends in a crosswise direction of the heat transfer foil 9. In the second embodiment, there are provided two grooves 14 on the top portions of the heat transfer foil 9. The grooves 14 may be provided at the bottom of the heat transfer foil 9, as in FIG. 10, or both at the top and bottom portions, as in FIG. 11. In the second embodiment, for instance, the heat transfer foil 9 has the thickness of approximately 20 to 100 micrometers, the pitch between the top portions or the bottom portions is approximately 0.5 to 2 millimeters and the height of the corrugation is approximately 0.5 to 2 millimeters.

The bottom portions of the heat transfer foil 9 are attached to a back surface of the semiconductor integrated circuit chips 1 which is opposite to the surface attached to the mounting substrate 3 through the bumps 2 The top portions of the heat transfer foil 9 are also attached to a back surface of the heat sink 8. In this case, although it is difficult to attach the heat transfer foil 9 to the semiconductor integrated circuit chips 1 and the heat sink 8 through the solder 10 made of Sb and Pb when Al and the like are used as a material of the heat transfer foil 9, Cu and the like which can directly be attached to the solder 10 made of Sb and Pb may be applied to the surface of the top and/or bottom of the heat transfer foil 9 to be attached, or be applied to all surface of the heat transfer foil 9 to completely to attach them.

In operation, when heat is generated by the plurality of the semiconductor integrated circuit chips 1, the heat transfer foil 9 is heated. Since the heat transfer foil 9 has a high heat conductivity, the heat is transferred through the heat transfer foil 9 to the heat sink 8. The heat is then radiated from the heat sink 8 to the exterior of the package for semiconductor device.

In more detail, the heat transfer foil 9 is made of a material having a high thermal conductivity such as Al, Cu and the like and has a corrugated structure having the top and bottom portions for increasing its effective area in order to be attached to both of the semiconductor integrated circuit chips 1 and the cap 7 by utilizing the wide area of the heat transfer foil 9. Therefore, a thermal resistance of all the heat transfer foil 9 can be reduced. Thus, the heat generated from the semiconductor integrated circuit chips 1 is effectively transferred to the heat sink 8 through the heat transfer foil 9, radiating the heat to the exterior of the package 24 from the heat sink 8. Consequently, the best radiation of the package can be improved.

A coefficient of thermal expansion of the semiconductor integrated circuit chips 1 is different from that of the heat sink 8. Thus, a thermal stress on account of the above difference appears between the semiconductor integrated circuit chips 1 and the heat sink 8 by a heat history. The heat transfer foil 9 is, however, excellent in its flexibility of a lengthwise and a crosswise direction since it has the corrugated structure and is provided with the grooves 14 in the top or top and bottom portions, as in FIG. 11. Therefore, the heat transfer foil 9 can absorb and mitigate the thermal stress. As a result, no influence of difference in the thermal expansion appears between the semiconductor integrated circuit chips 1 and the heat sink 8.

In addition, the semiconductor integrated circuit chips 1 are directly attached to the heat sink 8 through the heat transfer foil 9 without the cap like the first embodiment. Therefore, the thermal resistance between the semiconductor integrated circuit chips 1 and the heat sink 8 can be reduced. Further, the cost of fabricating the products embodying the second embodiment can be reduced since there is no need to attach the cap to the package 4.

In the second embodiment, the structure of the heat transfer foil 9 may be selected from a V-shaped corrugated and a curved corrugated structure, as in FIG. 12. Further, even if the heat transfer foil is provided to extend on the plurality of the semiconductor integrated circuit chips 1 mounted on the mounting substrate 3, a plurality of the heat transfer foil 9 is prepared and may be provided for each semiconductor integrated circuit chips 1 respectively. The fabrication of the heat transfer foil 9 is easy and it is easily, therefore, assembled to the package. Then, the cost of fabricating the package can be reduced.

Figure 8:
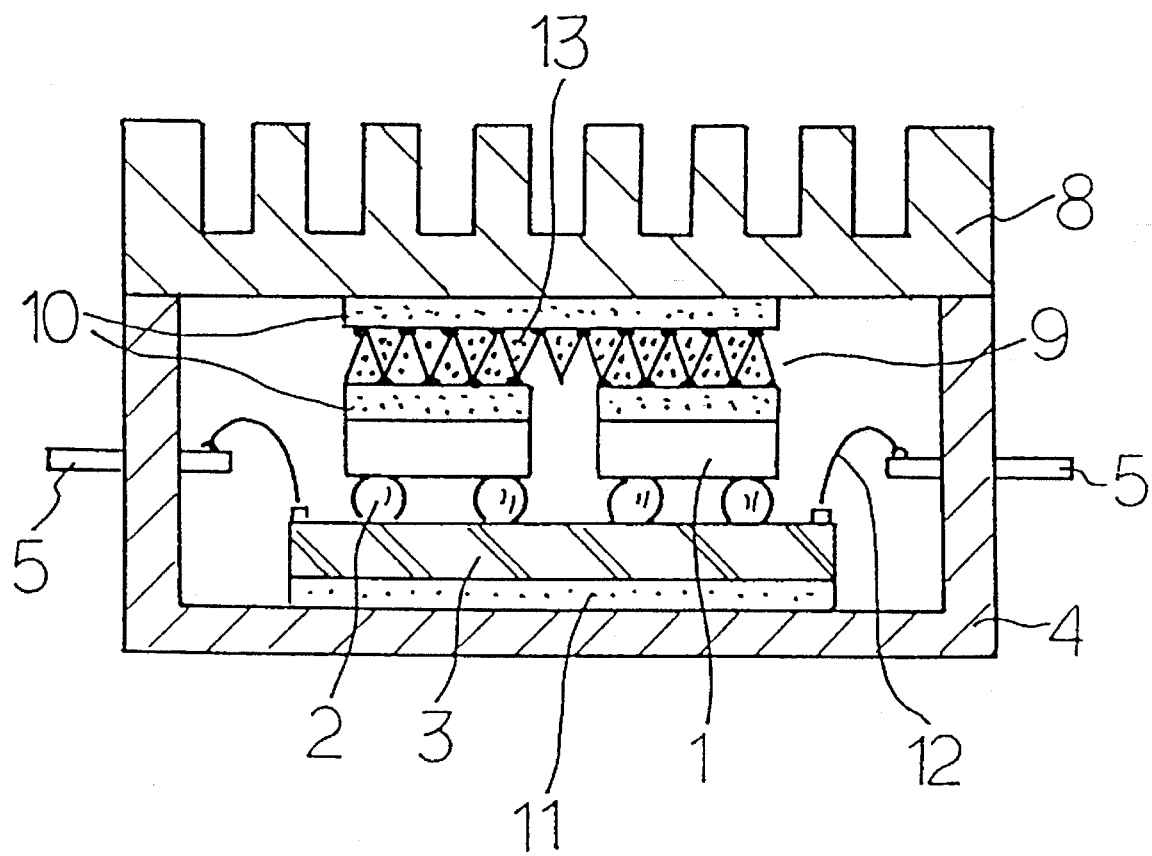
FIG. 8 is a cross sectional view showing the structure of a package with an improved heat transfer device for a semiconductor device of a third embodiment according to the invention.

A third embodiment according the invention will be described with reference to the drawings. FIG. 8 shows a package with an improved heat transfer device for semiconductor device.

A semiconductor integrated circuit chips 1 made of silicon and the like comprises active elements such as a transistor and passive elements such as a resistor. The semiconductor integrated circuit chips 1 are mounted on a mounting substrate 3 respectively through bumps 2 which are formed on electrode pads of the semiconductor integrated circuit chips I by use or a flip tip bonding method. The bumps 2 are made of a solder which comprises, for example, lead (Pb) (95% by weight) and tin (Sn) (5% by weight). The mounting substrate 3 is made of a material having a predetermined coefficient of thermal expansion similar to that of the semiconductor integrated circuit chips 1.

The mounting substrate 3 mounting the semiconductor integrated circuit chips 1 is attached to the bottom in a package 4 through an adhesive such as silicon resin. The semiconductor integrated circuit chips 1 are electrically connected to leads 5 provided to the package 4 through a metal wire made of Au. A heat sink 8 made of aluminum and the like is attached to an opening of the top of the package 4 for seal thereof.

Figure 9:
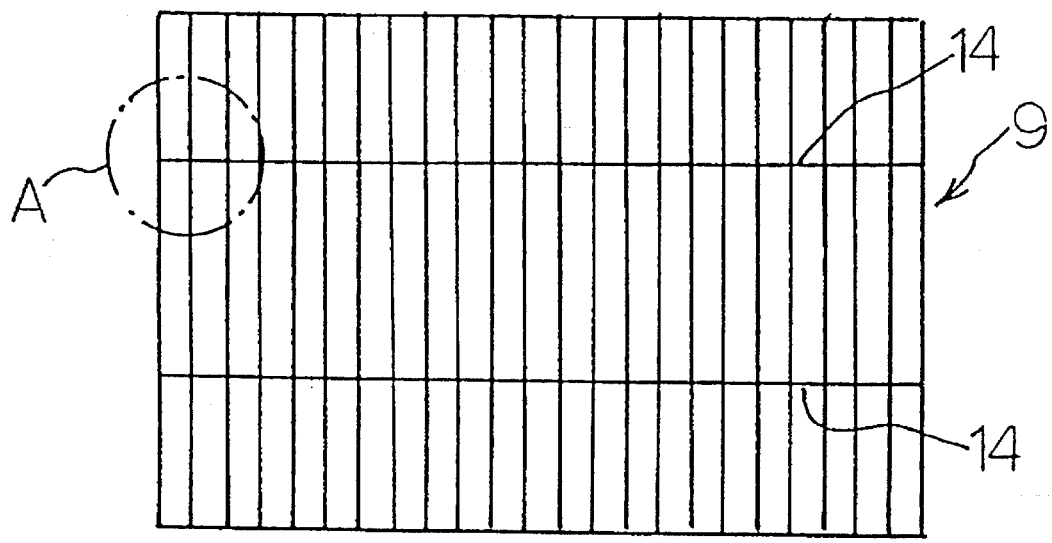
FIG. 9A is a plan view showing the structure of a heat transfer foil of a third embodiment according to the invention.
FIG. 9B is a perspective view showing the structure of a heat transfer foil of a third embodiment according to the invention.
Figure 9:
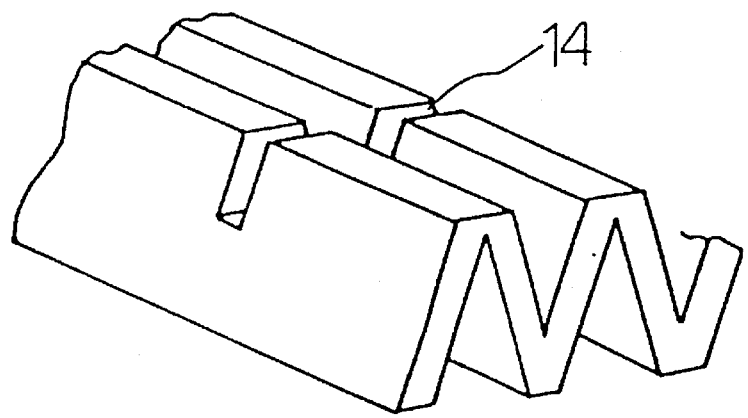

A heat transfer foil 9 is provided between the semiconductor integrated circuit chips 1 and the heat sink 8. The heat transfer foil 9 is made of aluminum, aluminum alloy, copper or copper alloy and have a corrugated structure having top portions and bottom portions. FIG. 9A shows a plan view of the heat transfer foil 9 and FIG. 9B shows a perspective view, which is taken on circle A of FIG. 9A, of the heat transfer foil 9. As shown in FIGS. 9A and 9B, a thin metal plate is pressed to have a corrugated structure, in which corrugations continue in a crosswise direction of the thin metal plate. A plurality of grooves 14 are formed in the top portion of the heat transfer foil 9 to separate the corrugations in a lengthwise direction and also extends in a crosswise direction of the heat transfer foil 9. In the third embodiment, there are provided two grooves 14 on the top portions of the heat transfer foil 9. The grooves 14 may be provided to the bottom of the heat transfer foil 9, as in FIG. 10, or both the top and bottom portions, as in FIG. 12. In the third embodiment, for instance, the heat transfer foil 9 has the thickness of approximately 20 to 100 micrometers, the pitch between the top portions or the bottom portions is approximately 0.5 to 2 millimeters arid the height of the corrugation is approximately 0.5 to 2 millimeters.

The bottom portions of the heat transfer foil 9 are attached to a back surface of the semiconductor integrated circuit chips I which is opposite to the surface attached to the mounting substrate 3 through solder 10. The top portions of the heat transfer foil 9 are also attached to a back surface of the heat sink 8 through solder 10. In this case, although it is difficult to attach the heat transfer foil 9 to the semiconductor integrated circuit chips 1 and the heat sink 8 through the solder 10 made of Sb and Pb when Al and the like are used as a material of the heat transfer foil 9, Cu and the like which can directly De attached to the solder 10 made of Sb and Pb may be applied to the surface of the top and/or bottom of the heat transfer foil 9 to be attached, or be applied to all surfaces of the heat transfer foil 9 to completely to attach them.

In the third embodiment, a resin 13 fills the space between the top portions and/or bottom portions. The resin 13 has a high thermal conductivity and a flexibility.

In operation, when heat is generated by the plurality of the semiconductor integrated circuit chips 1, the heat transfer foil 9 is heated. Since the heat transfer foil 9 has a high neat conductivity, the heat is transferred through the heat transfer foil 9 to the heat sink 8. The heat is then radiated from the heat sink 8 to the exterior of the package for semiconductor device.

In more detail, the heat transfer foil 9 is made of a material having a high thermal conductivity such as Al, Cu and the like and has a corrugated structure having top and bottom portions for increasing its effective area in order to be attached to both of the semiconductor integrated circuit chips 1 and the cap 7 by utilizing the wide area of the heat transfer foil 9. Therefore, a thermal resistance of all the heat transfer foil 9 can be reduced. Thus, the heat generated from the semiconductor integrated circuit chips 1 is effectively transferred to the cap 1 through the heat transfer foil 9, radiating the heat to the exterior of the package 24 from the heat sink 8. Consequently, the heat radiation of the package can be improved.

A coefficient of thermal expansion of the semiconductor integrated circuit chips 1 is different from that of the heat sink 8. Thus, a thermal stress on account of the above difference appears between the semiconductor integrated circuit chips 1 and the heat sink 8 by a heat history. The heat transfer foil 9 is, however, excellent in its flexibility of a lengthwise and a crosswise direction since it has the corrugated structure and is provided with the grooves 14 in the top and/or bottom portions. Therefore, the heat transfer foil 9 can absorb and mitigate the thermal stress. As a result, no influence of difference in the thermal expansion appears between the semiconductor integrated circuit chips 1 and the heat sink 8.

In addition, the semiconductor integrated circuit chips 1 are directly attached to the heat sink 8 through the heat transfer foil 9 without the cap like the first embodiment. Therefore, the thermal resistance between the semiconductor integrated circuit chips 1 and the heat sink 8 can be reduced. Further, the cost of fabricating the products utilizing the second embodiment can be reduced since there is no need to attach the cap to the package 4.

Further, since the mounting substrate 3 is directly attached to the bottom in the package 4, a strength against all oscillation to the package can be strengthened. Since the semiconductor integrated circuit chips 1 is connected to the leads 5 by use of the metal wires 12, there is no need to use the TAB and it is, therefore, possible to reduce the cost of fabricating the products.

Moreover, the resin 13 having the nigh thermal conductivity and the flexibility fills the spaces in the heat transfer foil 9. Thus, a strength of the heat transfer foil 9 against an oscillation to the package can be strengthened, an effective area of the heat transfer foil 9 can be increased, and, therefore, it is possible to reduce the heat resistance.

In the third embodiment, the structure of the heat transfer foil 9 may be selected from a V-shaped corrugated structure and a curved corrugated structure, as in FIG. 12. Even if the heat transfer foil is provided to extend on the plurality of the semiconductor integrated circuit chips 1 mounted on the mounting substrate 3, a plurality of the heat transfer foil 9 is prepared and may be provided for each semiconductor integrated circuit chips 1 respectively. Further, a cap like the first embodiment may be provided between the semiconductor integrated circuit chips 1 and the heat sink 8. The resin may be applied to the heat transfer foil 9 to have a predetermined thickness.

The fabrication of the heat transfer foil 9 is easy and it easily is assembled to the package, therefore, the cost of fabricating the package can be reduced.

Whereas modifications of the present invention will no doubt be apparent to a person of ordinary skilled in the art to which the invention pertains, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A high heat transfer structure comprising:

at least one semiconductor integrated circuit chip mounted on a substrate;

a heat radiation means for radiating heat to an exterior; and a corrugated foil made of a heat conductive material including corrugations having top portions in contact, through solder, with said chip and bottom portions in contact, through solder, with said heat radiation means for transferring said heat from said at least one semiconductor integrated circuit chip to said radiation means, said foil including grooves extending at said top portions in a crosswise direction of said corrugations.

2. A high heat transfer structure according to claim 1, wherein said heat transfer foil has a V-shaped structure.

3. A high heat transfer structure according to claim 1, wherein said heat transfer foil has a curved structure.

4. A high heat transfer structure according to claim 1, further comprising a resin having a high thermal conductivity and flexibility, said resin being provided on at least one surface of said foil.

5. A high heat transfer structure according to claim 1, wherein said heat transfer foil is made of aluminum.

6. A high heat transfer structure according to claim 1, wherein said heat transfer foil is made of an aluminum alloy.

7. A high heat transfer structure according to claim 1, wherein said heat transfer foil is made of copper.

8. A high heat transfer structure according to claim 1, wherein said heat transfer foil is made of a copper alloy.

9. A high heat transfer structure according to claim 1, wherein said heat radiation means is a heat sink.

10. A high heat transfer structure comprising:

at least one semiconductor integrated circuit chip mounted on a substrate;

a heat radiation means for radiating heat to an exterior; and a corrugated foil made of a heat conductive material including corrugations having top portions in contact, through solder, with said chip and bottom portions in contact, through solder, with said heat radiation means for transferring said heat from said at least one semiconductor integrated circuit chip to said radiation means, said foil including grooves extending at said bottom portions in a crosswise direction of said corrugations.

11. A high heat transfer structure comprising:

at least one semiconductor integrated circuit chip mounted on a substrate;

a heat radiation means for radiating heat to an exterior; and a corrugated foil made of a heat conductive material including corrugations having top portions in contact, through solder, with said chip and bottom portions in contact, through solder, with said heat radiation means for transferring said heat from said at least one semiconductor integrated circuit chip to said radiation means, said foil including grooves extending at both said top and bottom portions in a crosswise direction of said corrugations.

12. A heat transfer structure comprising:

at least one semiconductor integrated circuit chip mounted on a substrate;

a package for receiving said at least one semiconductor integrated circuit chip mounted on said substrate;

heat radiation means attached to said package for radiating heat to an exterior and for sealing said package; and a corrugated foil made of a heat conductive material including corrugations having top portions in contact, through solder, with said chip and bottom portions in contact, through solder, with said radiation means for transferring said heat from said semiconductor integrated circuit chip to said heat radiation means, said foil including grooves extending at said top portions in a crosswise direction of said corrugations.

13. A heat transfer structure according to claim 12, wherein said heat transfer foil has a V-shaped structure.

14. A heat transfer structure according to claim 12, wherein said heat transfer foil has a curved structure.

15. A heat transfer structure according to claim 12, further comprising a resin having a high thermal conductivity and flexibility, said resin being provided on at least one surface of said foil.

16. A heat transfer structure according to claim 12, wherein said heat transfer foil is made of aluminum.

17. A heat transfer structure according to claim 12, wherein said heat transfer foil is made of an aluminum alloy.

18. A heat transfer structure according to claim 12, wherein said heat transfer foil is made of copper.

19. A heat transfer structure according to claim 12, wherein said heat transfer foil is made of a copper alloy.

20. A heat transfer structure according to claim 12, wherein said heat radiation means is a heat sink.

21. A heat transfer structure according to claim 12, wherein said heat radiation means comprises a cap for sealing said package and a heat sink for radiating said heat.

22. A heat transfer structure comprising:

at least one semiconductor integrated circuit chip mounted on a substrate;

a package for receiving said at least one semiconductor integrated circuit chip mounted on said substrate;

heat radiation means attached to said package for radiating heat to an exterior and for sealing said package; and a corrugated foil made of a heat conductive material including corrugations having top portions in contact, through solder, with said chip and bottom portions in contact, through solder, with said radiation means for transferring said heat from said semiconductor integrated circuit chip to said heat radiation means, said foil including grooves extending at said bottom portions in a crosswise direction of said corrugations.

23. A heat transfer structure comprising:

at least one semiconductor integrated circuit chip mounted on a substrate;

a package for receiving said at least one semiconductor integrated circuit chip mounted on said substrate;

heat radiation means attached to said package for radiating heat to an exterior and for sealing said package; and a corrugated foil made of a heat conductive material including corrugations having top portions in contact, through solder, with said chip and bottom portions in contact, through solder, with said radiation means for transferring said heat from said semiconductor integrated circuit chip to said heat radiation means, said foil including grooves extending at both said top and bottom portions in a crosswise direction of said corrugations.

* * * * *